United States Patent [19]
Knudsen et al.

[11] Patent Number: 5,262,280
[45] Date of Patent: Nov. 16, 1993

[54] RADIATION SENSITIVE COMPOSITIONS

[75] Inventors: Philip D. Knudsen, Northboro; Charles R. Shipley, Newton; Daniel Y. Pai, Millbury, all of Mass.

[73] Assignee: Shipley Company Inc., Marlborough, Mass.

[21] Appl. No.: 862,343

[22] Filed: Apr. 2, 1992

[51] Int. Cl.$^5$ .......................... G03C 1/73; G03C 5/16
[52] U.S. Cl. .................................... 430/312; 430/315; 430/280
[58] Field of Search ............... 430/280, 319, 312, 315; 522/157, 166, 159, 158, 170

[56] References Cited

U.S. PATENT DOCUMENTS

| | | | |
|---|---|---|---|
| 3,877,941 | 4/1975 | Lohmann | 96/48 R |
| 4,035,189 | 7/1977 | Hayashi et al. | 96/115 R |
| 4,405,707 | 9/1983 | Bierhenke et al. | 430/312 |
| 4,579,885 | 4/1986 | Domeier et al. | 525/420 |
| 4,628,022 | 12/1986 | Ors et al. | 430/280 |
| 4,760,106 | 7/1988 | Gardner et al. | 523/433 |
| 4,902,610 | 2/1990 | Shipley | 430/312 |
| 4,987,264 | 1/1991 | Holoch et al. | 568/33 |

FOREIGN PATENT DOCUMENTS

0413087A1 2/1991 European Pat. Off.
0425142A2 5/1991 European Pat. Off.

OTHER PUBLICATIONS

*Chemical and Engineering News*, pp. 24-25 (Apr. 29, 1991).
J. Cameron et al, *J. Am. Chem. Soc.*, vol. 113, No. 11, 4303-4313 (1991).
J. Cameron et al, *J. Org. Chem.*, 55, 5919-5922 (1990).
M. Winkle et al, *Journal of Photopolymer Science and Technology*, vol. 3, No. 3, 419-422 (1990).
C. Kutal et al, *Journal of Coatings Technology*, vol. 62, No. 786, 63-67 (Jul. 1990).
H. Stenzenberger, *British Polymer Journal*, 20, 383-396 (1988).
R. Cummings et al, *Tetr. Letters*, vol. 29, No. 1, 65-68 (1988).
I. Varma, *polymer News*, vol. 12, No. 10, 294-306 (1987).
B. Amit, *J. Org. Chem.*, vol. 39, No. 2, 192-196 (1974).
A. Patchorik et al., *J. Am. Chem. Soc.*, 92:21, 6333-6334 (1970).
J. Barltrop et al, *J. Chem. Soc. Chem. Comm.*, 822-823 (1966).
Kutal et al, *Proc. Polym. Mat. Sci. Eng.*, 61, 195-198 (1989).
Frechet et al, *J. Polym. Mat. Sci. Eng.*, 64, 55-56 (Spring 1991).
Kutal et al, *J. Electrochem. Soc.*, vol. 134, No. 9, 2280-2285 (1987).
Beecher et al, *J. Poly. Mater. Sci. Eng.*, 64, 71-72 (1991).

*Primary Examiner*—Susan Berman
*Attorney, Agent, or Firm*—Robert L. Goldberg; Peter F. Corless

[57] ABSTRACT

Radiation sensitive compositions, processes for using the compositions, and articles of manufacture comprising the compositions. The photoimageable compositions of the invention comprises a radiation sensitive component, a resin binder and a polybutadiene that comprises one or more internal epoxide groups. In preferred aspects, the compositions of the invention further comprise a crosslinking agent such as a melamine or an epoxidized material, or mixtures thereof.

25 Claims, No Drawings

RADIATION SENSITIVE COMPOSITIONS

BACKGROUND OF THE INVENTION

1. Introduction

The present invention relates to radiation sensitive compositions and, more particularly, to photoimageable compositions that exhibit substantial flexibility upon curing, and processes and articles of manufacture that comprise such compositions.

2. Background Art

The need exists for new photoimageable coating compositions, particularly for electronics-related applications. For example, soldermasks, also known as solder resists, are compositions used to mask off a portion of a printed circuit board and prevent those areas from accepting solder during solder processing. See Coombs, *Printed Circuits Handbook*, ch. 16, McGraw Hill (3rd ed., 1988), incorporated herein by reference. Known commercially available photoimageable soldermasks form a relatively brittle coating layer upon curing. A brittle soldermask coating can pose notable problems. For example, a brittle coating may be degraded during processing and prior to application of solder, thereby resulting in complete rejection of the board or requiring the removal of the cured composition and board reprocessing.

Moreover, such brittle coatings are not useful for flexible circuit manufacture. Flexible circuits have been defined as a patterned arrangement of printed circuits and components utilizing flexible base materials with or without non-photoimageable flexible cover layers or "coats". See Coombs, *Printed Circuits Handbook*, ch. 35, McGraw Hill (3rd ed., 1988), incorporated herein by reference. For typical applications, only two types of cover coats are used—non-photoimageable polyimide and polyester. Other non-photoimageable cover coats also are used such as Teflon and Ultem, but their utility is typically limited to specialized applications. Current fabrication methods of a flexible circuit include prepunching the cover coats with holes for solder pads and then carefully aligning the cover coat on the base material. Current industry demands call for more aperatures in the cover coat layer, more precise registration of the aperatures with the base layer and good bonding of the cover coat to the underlying base layer. To achieve these goals, it would be desirable to have a photoimageable dielectric coating composition that upon curing exhibited sufficient flexibility to serve as a cover coat layer. By employing a photoimageable composition, aperatures could be imaged and developed in the cover coat layer.

Multichip modules have gained increased use, particularly in advanced computer systems. See Technology Update (9108, Multichip Modules and Their Impact on Board Makers," RP428-RT, BPA (Technology and Management) LTD (September 1991); and J. Balde, "Multichip Modules: The Construction in Use Today", *Proceedings NEPCON-West*, 965-974 (February 1990), both incorporated herein by reference. Materials of construction of multichip modules include for example aluminum nitride, silicon carbide, alumina coated copper-tungsten, silcion wafers with external mechanical support and CVD diamond coated ceramics. Manufacture of devices comprising such substrate materials will require dielectric coating compositions with improved CTE characteristics at operation temperatures (e.g., a CTE of less than 30 ppm at 200° C.) and ever lower dielectric constants, including dielectric constants of less than about 3. It thus would be desirable to have coating compositions that provide such performance characteristics and could be used in MCM manufacturing processes.

Present trends in the printed wiring board industry are towards increasing the number of circuit layers in a board and decreasing the widths of formed lines and spaces. Conventional multilayer printed circuit boards comprise glass cloth reinforced copper-clad plastic substrates that range in thickness from 4–8 mils for the insulative plastic alone. After etching desired circuitry configurations on a signal layer, the board innerlayers are laminated to form a multilayer board comprising circuitry, ground plane and power plane levels. Holes are drilled through the board stack and the hole walls plated to formed conductive interconnects between the multiple board layers. This manufacturing process poses notable problems such as drill wear, smear and hole size limitations, all inherent in such a drilled board approach. Also, circuit densification is curtailed by the presence of relatively large via apertures (typically 12–20 mil in diameter) which necessitate pads that consume additional board space.

A means to avoid such problems is a multilayer circuit board manufacturing process where board layers are formed sequentially using selective plating techniques and imaging of dielectric materials to achieve fine line resolution and interconnections between circuits. Such a manufacturing process has been described in U.S. Pat. No. 4,902,610, incorporated herein by reference. It thus would be desirable to have a new photoimageable coating composition that has utility as a dielectric material in such a sequential circuit board fabrication process.

SUMMARY OF THE INVENTION

The present invention provides novel radiation sensitive coating compositions that are characterized in part as providing a cured coating layer that exhibits substantial flexibility. In general, a composition of the invention comprises a resin binder, a reactive polybutadiene that comprises one or more internal epoxide groups, and a radiation sensitive component. As used herein, the term "polybutadiene" refers to a material that is obtainable from the reaction of a butadiene monomer, oligomer or polymer. For example, the term "polybutadiene" includes a butadiene dimer. As used herein, the term "polybutadiene that contains one or more internal epoxide groups" refers to a polybutadiene that comprises one or more oxirane oxygens bonded to carbons within the polybutadiene backbone, rather than an epoxide group pendant to the butadiene backbone or an epoxide group that is a bonded to a terminal carbon of the butadiene chain. It is also understood that a polybutadiene that comprises one or more internal epoxide groups also suitably may comprise one or more pendant and/or terminal epoxide groups. Preferably the epoxidized polybutadiene is miscible with the other components of the composition both before and after curing of a coating layer of the composition.

While substantially non-reactive resin binders are suitably employed in the compositions of the invention, preferably the resin binder is a reactive polymer that can undergo photoactivated crosslinking with one or more components of the composition. Preferably a composition of the invention further comprises one or more one crosslinking agents in addition to the epoxidized polybutadiene component.

A variety of resin binders can be employed. Suitable reactive resins are those that contain a functional group that can react with one or more other components of the composition, for example a reactive hydrogen containing resin. Generally preferred reactive resins are phenolic resins. With respect to the crosslinker component, a variety of crosslinking agents may be employed. Preferred crosslinkers include an epoxy-containing material and amine-based crosslinkers such as a melamine, and mixtures thereof. Such crosslinkers will cure to form a polymerized network with the reactive resin binder and internally epoxidized polybutadiene, for example a cured terpolymeric mixture where a single crosslinker is employed or a cured tetrapolymeric mixture where two different types of crosslinkers are employed. The radiation sensitive component can comprise a compound that generates acid (i.e., an photoacid generator) or generates base (i.e., a photobase generator) upon exposure to activating radiation. Compositions of the invention are suitable for use as a liquid coating composition as well as a dry film.

The compositions of the invention have utility in a variety of applications. Hence, the invention includes processes employing the compositions of the invention, including processes for forming a relief image, processes for forming an imaged dielectric layer on a substrate, and processes for the manufacture of printed circuit boards, additive printed circuits, multilayer printed circuits, high density printed circuits, flexible circuits, surface mount devices, multichip modules and other articles. The invention further provides novel articles of manufacture comprising substrates coated with the compositions of the invention.

The terms "crosslink", "crosslinking" and other such terms used herein refer to any reaction of one or more of the components of a composition of the invention that results in reduced developer solubility of the composition.

DETAILED DESCRIPTION OF THE INVENTION

A composition of the invention in general comprises a resin binder, an epoxidized polybutadiene that contains internal epoxide groups, and a radiation sensitive component. Preferably the compositions further comprise an additional crosslinking agent component such as a melamine.

The resin binder component may comprise a nonreactive resin or, preferably, the resin binder is a reactive resin that can undergo photointitiated crosslinking with one or more components of the composition. The resin binder preferably imparts aqueous developability to the composition. Thus, preferred resin binders include resins that contain polar functional groups, such as hydroxyl or carboxylate, that can impart aqueous developability. Further, the resin binder component is preferably employed in a composition in a concentration sufficient to render unexposed portions of a coating layer of the composition aqueous developable.

The term "nonreactive resin" as used herein refers to a resin that does not substantially polymerize with one or more of the components of the composition upon photoactivation of the same. Thus, upon curing of a composition, a nonreactive resin binder typically will be encapsulated within the polymerizable component(s) of the composition. Suitable nonreactive resins include, for example, acrylate polymers, preferably aqueous soluble acrylates such as acrylate polymers that contain carboxyl groups. The resin binder component suitably may comprise both nonreactive and reactive resin binders.

A reactive resin binder is suitably any of a variety of materials that will undergo photoinitiated crosslinking with one or more components of the composition. Thus suitable resins include those that contain one or more reactive moieties, for example a functionality that contains a reactive hydrogen. Phenolic resins are particularly suitable reactive resins and are preferably employed in a concentration sufficient to render a coating layer of the composition developable with an aqueous solution or semi-aqueous solution. Suitable phenolic resins include, for example, phenol aldehyde condensates known in the art as the novolak resins, homo and copolymers of alkenyl phenols, partially hydrogenated novolak and poly(vinylphenol) resins, and homo and copolymers of N-hydroxyphenyl-maleimides.

Of the phenolic resins suitable as a reactive resin for the compositions of the invention, the phenol formaldehyde novolaks are preferred materials as the novolaks are able to form an aqueous developable, photoimageable coating composition. These resins are made following procedures known and disclosed in numerous publications such as DeForest, *Photoresist Materials and Processes*, McGraw-Hill Book Company, New York, Ch. 2, 1975; Moreau, *Semiconductor Lithography Principles, Practices and Materials*, Plenum Press, New York, Chs. 2 and 4, 1988; and Knop and Pilato, *Phenolic Resins*, Springer-Verlag, 1985, all said publications incorporated herein by reference for their teaching of making and using novolaks and other phenolic resins.

More particularly, novolak resins are the thermoplastic condensation product of a phenol and an aldehyde. Examples of suitable phenols for condensation with an aldehyde, especially formaldehyde, for the formation of novolak resins, include phenol; m-cresol; o-cresol; p-cresol; 2,4-xylenol; 2,5-xylenol; 3,4-xylenol; 3,5-xylenol; thymol and mixtures thereof. An acid catalyzed condensation reaction results in the formation of a suitable novolak resin which may vary in molecular weight from about 500 to 100,000 daltons. Preferred novolak resins include the cresol formaldehyde condensation products.

Another preferred reactive resin is a poly(vinylphenol) resin. Poly(vinylphenols) are thermoplastic materials that may be formed by block polymerization, emulsion polymerization or solution polymerization of corresponding monomers in the presence of a cationic catalyst. Vinylphenols used for production of poly(vinylphenol) resins may be prepared, for example, by hydrolysis of commercially available coumarins or substituted coumarins, followed by decarboxylation of the resulting hydroxy cinnamic acids. Useful vinyl phenols may also be prepared by dehydration of the corresponding hydroxy alkyl phenol or by decarboxylation of hydroxy cinnamic acids resulting from the reaction of substituted or non-substituted hydroxy benzaldehydes with malonic acid. Preferred poly(vinylphenol) resins prepared from such vinyl phenols have a molecular weight range of from about 2,000 to about 100,000 daltons. Procedures for the formation of poly(vinylphenol) resins also can be found in U.S. Pat. No. 4,439,516, incorporated herein by reference.

Other suitable reactive resins are polymers containing phenolic units and nonaromatic cyclic alcohol units analogous in structure to the novolak resins and poly(- vinylphenol) resins. Such copolymer resins are described in European Published Patent Application No. 0 401 499 having a publication date of Dec. 12, 1990 and incorporated herein by reference.

An additional class of suitable phenolic reactive resins include homo and copolymers of N-hydroxyphenyl maleimides. Such materials are disclosed in European Published Application No. 0,255,989 beginning on page 2, line 45 and continuing to page 5, line 51, incorporated herein by reference.

The concentration of the resin component of the compositions of the invention may vary within relatively broad ranges, and in general the resin component is between about 30 and 60 or more weight percent of total solids of the compositions. In general a reactive resin is employed in a composition in a concentration of from about 0 (where only nonreactive resin(s) are employed) to 60 or more weight percent of the total solids of the composition. As used herein, the term total solids of a composition refers to all components of a composition other than a solvent carrier.

The second component of the compositions of the invention is an epoxidized polybutadiene that comprises one or more internal epoxide groups. The epoxidized polybutadiene suitably may also contain reactive groups in addition to one or more internal epoxy functionalities. For example, the butadiene may contain one or more vinyl groups, hydroxyl groups, carboxyl groups or pendant and/or terminal epoxy groups.

Particularly preferred expoxidized polybutadienes of the compositions of the invention are represented by the following formula (I):

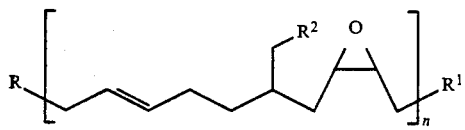

(I)

where R and R[1] are each independently selected from the group consisting of hydrogen, substituted and unsubstituted alkyl, substituted and unsubstituted aryl and a reactive group such as hydroxy, epoxy or an alkylene group, for example an alkylene group having from 2 to 10 carbon atoms, more typically having 2 carbon atoms. Suitable alkyl groups include those having from 1 to about 10 carbon atoms, more typically from 1 to about 6 carbon atoms. Phenyl is a suitable aryl group. The alkyl and aryl groups may be suitably substituted by, for example, aryl, alkyl, alkylene, halo, alkoxy or hydroxy. The group $R^2$ of formula (I) is preferably an alkylene carbon that forms a vinyl group with the carbon pendant to the butadiene backbone (i.e., $R^2$ is $CH_2=$), although a polybutadiene of formula (I) can be modified so that for one or more units of the butadiene the group $R^2$ is other than an alkylene carbon. For example such an alkylene group can be saturated so that $R^2$ is an alkyl carbon such as methyl. The value n of the above formula (I) is suitably 2 or greater, more preferably n is a value between about 10 and 25, still more preferably n is a value between about 20 and 25.

The polybutadiene of formula (I) above preferably has a molecular weight (weight average) of at least about 4000, preferably has a molecular weight of between about 4000 and 8000, still more preferably has a molecular weight between about 5000 and 6000.

A polybutadiene of formula (I) can be prepared in several ways. For example, a commercially available polybutadiene can be selectively oxidized to provide internal epoxide groups. Typically poly-1,3-butadienes are employed. Polybutadienes, including polybutadiene that with varying terminal groups including reactive groups such as hydroxy, are available from vendors such as BF Goodrich, Nisso, and Japan Synthetic Rubber. Under appropriate reaction conditions, an internal alkylene group will be more reactive to electrophilic substitution than a pendant vinyl group (i.e., where $R^2$ above is an alkylene carbon). Thus, an internal carbon-carbon double bond of the polybutadiene can be converted to a halohydrin by reaction with a halogen such as $Cl_2$ or $Br_2$ in the presence of water and a substantially non-nucleophilic solvent such as tetrahydrofuran or an aromatic solvent such as toluene or xylene. The epoxide can then be formed by alkaline treatment of the halohydrin. Suitable bases for formation of the internal epoxide via a halohydrin include alkoxides such as potassium t-butoxide and hydroxides such as sodium hydroxide. In formation of the halohydrin, a stoichiometric equivalent of halogen should be employed to limit addition to the more reactive disubstituted internal vinyl groups of the polybutadiene.

It is also believed that direct oxidation of the internal alkylene group of the polybutadiene can be employed to form a epoxidized polybutadiene of the invention. For example, a commercially available polybutadiene can be admixed in a suitable solvent and reacted with a suitable oxidant to provide the epoxide group. Suitable oxidants will include peracids such as perbenzoic acid, meta-chlorobenzoic acid, peracetic acid and trifluoroperacetic acid; alkaline oxidants such as sodium hydroxide and hydrogen peroxide (30 wt. % in water); or a substantially neutral oxidation of bubbling $O_2$ gas through the reaction mixture in the presence of a suitable catalyst such as Ag.

The internally epoxidized polybutadiene is preferably miscible with other component(s) of the composition both before and after curing. An epoxidized polybutadiene that is miscible with other components upon curing is believed to form a clear coating layer upon curing of the composition while a butadiene that is not miscible will provide an opaque cured coating layer, for example a milky-colored coating layer. While not wishing to be bound by theory, it is believed a clear, cured coating layer indicates the formation of a polymerized network comprising a substantially uniform distribution of the polymerizable components of the composition.

The concentration of the internally epoxidized butadiene component may vary within relatively broad ranges, and in general the internally epoxidized polybutadiene is employed in a concentration of at least about 10 weight percent of the total solids of a composition, more typically from about 10 to 60 or more weight percent of the total solids, still more typically from about 25 to 55 weight percent of total solids of a composition.

The compositions of the invention further comprise a radiation sensitive component. The radiation sensitive component will typically be an additional material in the composition, although the present invention includes compositions where the radiation sensitive component in an integral part of another component of the composition, for example a resin binder that comprises pendant photoactive groups, or a binder that comprises a photoactive group as a unit of the polymer chain.

The radiation sensitive component is selected from the group consisting of a compound that is capable of generating acid upon exposure to activating radiation (i.e., an acid generator) and a compound capable of generating base upon exposure to activating radiation (i.e., a base generator compound).

A generally preferred photoacid generator is the onium salts, preferably those with weakly nucleophilic anions. Such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryldiazonium salts and onium salts of group Va and b, Ia and b and I of the Periodic Table, for example, halonium salts, particularly aromatic iodonium and iodoxonium salts, quaternary ammonium, phosphonium and arsonium salts, aromatic sulfonium salts and sulfoxonium salts or selenonium salts. Examples of suitable onium salts can be found in U.S. Pat. Nos. 4,442,197; 4,603,101; and 4,624,912, all incorporated herein by reference.

Another suitable group of acid generating compounds are the iodonium salts. A preferred group of such salts are those resulting from the aryliodosotosylates and aryl ketones as disclosed, for example, in U.S. Pat. No. 4,683,317, incorporated herein by reference.

Of the acid generators, at least some non-ionic organic compounds should be suitable. Preferred non-ionic organic acid generators include halogenated non-ionic compounds such as, for example, 1,1-bis[p-chlorophenyl]-2,2,2-trichloroethane (DDT); 1,1-bis[p-methoxyphenyl]-2,2,2-trichloroethane (methoxychlor ®); 1,2,5,6,9,10-hexabromocyclododecane; 1,10-dibromodecane; 1,1-bis[p-chlorophenyl]2,2-dichloroethane; 4,4'-dichloro-2-(trichloromethyl)benzhydrol, 1,1-bis(-chlorophenyl)2-2,2-trichloroethanol (Kelthane ®); hexachlorodimethylsulfone; 2-chloro-6-(trichloromethyl)pyridine; O,O-diethyl-O-(3,5,6-trichloro-2-pyridyl)phosphorothioate (Dursban ®); 1,2,3,4,5,6-hexachlorocyclohexane; N(1,1-bis[p-chlorophenyl]-2,2,2-trichloroethylacetamide, tris[2,3-dibromopropyl] isocyanurate; 2,2-bis[p-chlorophenyl]-1,1-dichloroethylene; and their isomers, analogs, homologs and residual compounds. Of the above, tris[2,3-dibromopropyl] isocyanurate is particularly preferred. Suitable acid generators are also disclosed in European Published Patent Application No. 0232972, incorporated herein by reference. The term residual compounds as used above is intended to include closely related impurities or other modifications of the above halogenated organic compounds which result during their synthesis and which may be present in minor amounts in commercial products containing a major amount of the above compounds.

Suitable photobase generator compounds photodecompose (e.g., undergo photocleavage) upon exposure to activating radiation to provide a base. A base generator typically will be a neutral compound that generates base (e.g., an organic base such as an amine) upon photoactivation. It is believed that a variety of base generator compounds will be suitable for use in the compositions of the invention. Suitable base generators include organic compounds, for example, photoactive carbamates including benzyl carbamates and benzoin carbamates. Other suitable organic base generators include O-carbamoylhydroxylamines, O-carbamoyloximes, aromatic sulfonamides, alpha-lactones, amides such N-(2-arylethyenyl)amides, and amides. More specifically, suitable O-carbamoylhydroxylamines include compounds of the formula $RR^1OC(=O)NR^2R^3$ where R and $R^1$ are independently alkyl, aryl or acyl, $R^2$ is hydrogen or alkyl and $R^3$ is alkyl or aryl. Suitable O-carbamoyloximes include compounds of the formula $RR^1C(=N)OC(=O)NR^2R^3$ where R and $R^1$ are independently hydrogen, alkyl or aryl, $R^2$ is alkyl or aryl and $R^3$ is hydrogen or alkyl. Suitable sulfonamides include compounds of the formula $ArS(=O)_2NRR^1$ where Ar is an aryl group, R is hydrogen or alkyl and $R^1$ is alkyl or aryl. Suitable alpha-lactams include compounds of the formula (II):

where R is alkyl or aryl and $R^1$ is alkyl or aryl. Suitable N-(2-arylethyenyl)amides include compounds of the structure $RC(=O)N(R^1)CH=CHAr$ where Ar is an aryl group, R is alkyl or aryl and $R^1$ is alkyl. Other amides also will be suitable, for example formanilide and other aryl substituted amides. In the above described formulas, aryl is typically phenyl. As referred to in the above formulas, an alkyl group may be of a straight chain or branched configuration, or comprise a cyclic structure, and typically contains from 1 to 15 carbon atoms, more typically from 1 to 6 carbon atoms. An alkyl group is suitably either unsubstituted or substituted at one or more available positions. The substituents may be, for example, halo, aryl, or alkyl. Similarly, an aryl group also may be unsubstituted or substituted at one or more available positions by, for example, halo, aryl or alkyl.

Specifically preferred organic base generators include 2-hydroxy-2-phenylacetophenone N-cyclohexyl carbamate [i.e., $(C_6H_5C(=O)CH(C_6H_5)OC(=O)NH C_6H_{11}]$, o-nitrobenzyl N-cyclohexyl carbamate [i.e., $o-NO_2C_6H_5CH_2OC(=O)NHC_6H_{11}$], N-cyclohexyl-2-naphthalene sulfonamide [i.e., $C_{10}H_7SO_2NHC_6H_{11}$], 3,5-dimethoxybenzyl N-cyclohexyl carbamate [i.e., $(CH_3O)_2C_6H_5CH_2OC(=O)NHC_6H_{11}$], N-cyclohexyl p-toluene sulfonamide [i.e., $p-CH_3C_6H_5SO_2NHC_6H_{11}$], and dibenzoin isophorone dicarbamate.

Metal coordination complexes that generate base upon exposure to activating radiation also will be suitable, such as the cobalt (III) complexes described in J. Coatings Tech., 62, no. 786, 63–67 (July 1990), incorporated herein by reference. The described photoactive materials include compounds of the formula $Co(NH_2R)_5X^{n+}$ where R is hydrogen, methyl or n-propyl, X is $Cl^-$, $Br^-$, $I^-$ or other uninegative groups when n=2; and X is $RNH_2$ or $H_2O$ when n=3, and a suitable counter ion chosen to impart the desired solubility. Suitable counter ions include, for example $Cl^-$, $Br^-$ or $ClO_4^-$. Additionally, other metal coordination complexes that generate base upon exposure to activating radiation will be suitable photobase generators for use in the compositions of the invention.

Preparation of photobase generator compounds is known in the art. For example, suitable benzyl carbamates can be prepared by the reaction of a diisocyanate with a benzyl alcohol in the presence of a suitable catalyst. Thus dibenzoin isophorone dicarbamate is prepared by reaction of benzoin with isophorone diisocyanate in a suitable solvent, typically with heating, and in the presence of a suitable catalyst such as methyllithium. Suitable solvents include ether and tetrahydrofuran. Photoactivation of this base generator provides isophoronediamine. See J. Cameron et al., *J. Am. Chem. Soc.*, vol. 113, no. 11, 4303–4313 (1991); J. Cameron et al., *J. Polym. Mater. Sci. Eng.*, 64, 55 (1991); and J. Cameron, et al., *J. Org. Chem.*, 55, 5919–5922 (1990), all of which are incorporated herein by reference for their teaching of preparation of photobase generators. Orthonitrobenzyl N-cyclohexylcarbamate can be prepared by reaction of cyclohexylisocyanate and 2-nitrobenzyl alcohol in a heated toluene solution until reaction completion. Thin layer chromatography can be employed to monitor progress of the reaction. Suitable reaction temperatures include temperatures at or about 110° C. See European Patent Application 0425 142 A2, publication date Feb. 5, 1991, incorporated herein by reference for its teaching of photobase generators and the preparation thereof. The synthesis of sulfonamides is well known and generally involves reaction of a sulfonyl chloride with an amine. Thus N-cyclohexyl p-toluene sulfonamide is prepared by reaction of p-toluenesulfonyl chloride and cyclohexyl amine in a suitable solvent with heating. Suitable solvents include for example tetrahydrofuran and toluene. A photoactive polymer may also be prepared and used in the compositions of the invention as the photobase generator component. For example, a polymer containing pendant photoactive carbamate groups can be employed. Such a polymer can be prepared by adding a tetrahydrofuran solution of a catalytic amount of 4-dimethylaminopyridine and triethylamine to a mixture of o-nitrobenzyloxycarbonyl chloride and p-aminostyrene. Upon reaction completion, the reaction product can be purified by standard means, for example flash column chromatography, to yield the o-nitrobenzyloxycarbonyl carbamate of p-aminostyrene. Other polymers will undergo similar reaction with a benzyl carbonyl chloride, for example copolymers such as poly(p-aminostyrene-co-styrene) and poly(p-aminostyrene-co-methyl methacrylate).

A photoacid or photobase generator should be present in a composition of the invention in an amount sufficient to enable development of a coating layer of the composition following exposure of the same to activating radiation and a post-exposure bake, if needed. More specifically, a photoacid generator or photobase generator is typically employed in a composition in a concentration of from about 1 to 15 weight percent of total solids of the composition, more typically from about 1 to 6 weight percent of total solids of the composition, although it should be clear that suitable concentrations of the photoactive component can vary with the particular agent that is employed.

In addition to the resin binder and polybutadiene with internal expoxide groups, a preferred further component of the compositions of the invention is one or more materials capable of crosslinking with one or more components of the composition. The crosslinking material is suitably a monomer, oligomer or polymer.

A preferred crosslinker is an amine-based material such as a melamine monomer, oligomer or polymer, and various resins such as melamine-formaldehyde, benzoguanamine-formaldehyde, urea-formaldehyde and glycoluril-formaldehyde resins, and combinations thereof. These resins may be prepared by the reaction of acrylamide or methacrylamide copolymers with formaldehyde in an alcohol-containing solution, or alternatively by the copolymerization of N-alkoxymethylacrylamide or methacrylamide with other suitable monomers. Specifically suitable amine-based crosslinkers include the melamines manufactured by American Cyanamid Company of Wayne, N.J., such as Cymel® 300, 301, 303, 350, 370, 380, 1116 and 1130; benzoguanamine resins such as Cymel® 1123 and 1125; the glycoluril resins Cymel® 1170, 1171 and 1172; and the urea-based resins Beetle® 60, 65 and 80. A large number of similar amine-based compounds are commercially available from various suppliers.

Of the above amine-based crosslinkers, the melamines are preferred. Particularly preferred are melamine formaldehyde resins, i.e., reaction products of melamine and formaldehyde. These resins are typically ethers such as trialkylol melamine and hexaalkylol melamine. The alkyl group may have from 1 to as many as 8 or more carbon atoms but is preferably methyl. Depending upon the reaction conditions and the concentration of formaldehyde, the methyl ethers may react with each other to form more complex units.

Epoxy containing materials are another preferred group of crosslinkers. Epoxy containing materials are any organic compounds having one or more oxirane rings that are polymerizable by ring opening. Such materials, broadly called epoxides, include monomeric epoxy compounds, and oligomeric and polymeric epoxides that may be aliphatic, cycloaliphatic, aromatic or heterocyclic. Preferred materials generally, on average, have at least 2 polymerizable epoxy groups per molecule. The polymeric epoxides include linear polymers having terminal epoxy groups (e.g., diglycidyl ether of a polyoxyalkylene glycol), polymers having skeletal oxirane units (e.g., polybutadiene polyepoxide), and polymers having pendant epoxy groups (e.g., glycidyl methacrylate polymer of copolymer). The epoxides may be pure compounds but are generally mixtures containing one, two or more epoxy groups per molecule.

Useful epoxy-containing materials may vary from low molecular weight monomeric materials and oligomers to relatively high molecular weight polymers and may vary greatly in the nature of their backbone and substituent groups. For example, the backbone may be of any type and substituent groups may be any group free of any substituents reactive with an oxirane ring at room temperature. Illustrative of suitable substituents include halogens, ester groups, ethers, sulfonate groups, siloxane groups, nitro groups, phosphate groups, etc.

Further epoxy containing materials useful in the practice of this invention include glycidyl ethers. Examples are the glycidyl ethers of polyhydric phenols obtained by reacting a polyhydric phenol with an excess of chlorohydrin such as epichlorohydrin (e.g., the diglycidyl ether of 2,2-bis-(2,3-epoxypropoxyphenol)propane). Further examples of epoxides of this type are described in U.S. Pat. No. 3,018,262, incorporated herein by reference.

There are many commercially available epoxy containing materials which can be used in the compositions of the invention. In particular, epoxides which are readily available include epichlorohydrin, glycidol, glycidylmethacrylate, the glycidyl ether of p-tertiarybutylphenol (e.g., those available under the trade name "Epi-Rez" 5014 from Celanese); diglycidyl ether of Bisphenol A (e.g., those available under the trade designations "Epon 828", "Epon 1004" and "Epon 1010" from Shell Chemical Co.; and "DER-331", "DER-332" and "DER-334" from Dow Chemical Co.), vinylcyclohexene dioxide (e.g., "ERL-4206" from Union Carbide Corp.), 3,4-epoxy-6-methyl-cyclohexyl-methyl-3,4-epoxy-6-methylcyclohexene carboxylate (e.g., "ERL-4201" from Union Carbide Corp.), bis(3,4-epoxy-6-methylcyclohexylmethyl) adipate (e.g., "ERL-4289" from Union Carbide Corp.), bis(2,3-epoxycyclopentyl) ether (e.g., "ERL-0400" from Union Carbide Corp.), aliphatic epoxy modified with polypropylene glycol (e.g., "Erl-4050" and "ERL-4269" from Union Carbide Corp.), dipentene dioxide (e.g., "ERL-4269" from Union Carbide Corp.), flame retardant epoxy resins (e.g., "DER-580," a brominated bisphenol type epoxy resin available from Dow Chemical Co.), 1,4-butanediol diglycidyl ether of phenolformaldehyde novolak (e.g., "DEN-431" and "DEN-438" from Dow Chemical Co.), and resorcinol diglycidyl ether (e.g., "Kopoxite" from Koppers Company, Inc.).

A compound that contains at least two vinyl ether groups is a suitable crosslinker for compositions that comprise a photoacid generator compound. Examples of compounds with at least two vinyl ether groups include divinyl ethers of aliphatic, cycloaliphatic, aromatic or araliphatic diols. Examples of such materials include divinyl ethers of aliphatic diols having from 1 to 12 carbon atoms, polyethylene glycols, propylene glycols, polybutylene glycols, dimethylcyclohexanes, etc. Specific examples include divinyl ethers of ethylene glycol, trimethylene-1,3-diol, diethylene glycol, triethylene glycol, dipropylene glycol, tripropylene glycol, resorcinol, Bisphenol A, etc.

A compound that contains one or more electrophilic multiple bonds is a suitable crosslinker at least for compositions that comprise a photobase generator compound. Examples of electrophilic multiple bonds include maleimides, alpha,beta-unsaturated ketones, esters, amides, nitriles and other alpha,beta-unsaturated electron-withdrawing groups. Typically the electrophilic multiple bond will be a carbon-carbon double bond activated by one or more electron-withdrawing substitutents, although activated acetylenes can also function as the electrophilic species. Preferred is a crosslinker that comprises two or more electrophilic multiple bonds. Particularly preferred are those active groups that comprise a carbon-carbon multiple bond that is stabilized by two electron-withdrawing substituents such as malonate esters or beta-keto esters or, preferably, maleimide groups. These Michael acceptors will undergo a base-initiated reaction with a suitable nucleophile. For example, in the compositions of the invention, the above described phenolic resin binders, epoxidized polybutadiene containing one or more internal epoxide groups, and/or the photoactivated base can undergo addition with these crosslinker materials that contain an electrophilic multiple bond.

Particularly preferred crosslinking materials that contain an electrophilic multiple bond include a crosslinker that contains one or more maleimide groups, and specifically preferred are bismaleimides of the following formula (III):

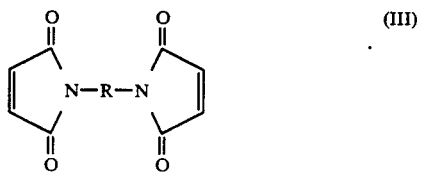

(III)

wherein R is selected from the group consisting of substituted or unsubstituted aryl, substituted or unsubstituted alkyl, or a group of the formula $R^1-Ar-R^2-Ar'-R^3$, where $R^1$, $R^2$ and $R^3$ are independently selected from the group consisting of a substituted or unsubstituted alkyl, and Ar and Ar' are each independently selected from the group consisting of substituted or unsubstituted aryl. Said substituted aryl and alkyl groups of the compounds of formula (III) are suitably substituted by one or more functionalities such as, for example, halogen, alkoxy (such as methoxy, ethoxy, etc.), aryl and alkyl. Said substituted and unsubstituted alkyl groups of formula (III) preferably have from 1 to 8 carbon atoms, more preferably 1 to 4 carbon atoms. Aryl groups are preferably phenyl. A specifically preferred compound of formula (III) is 1,1'-(methylenedi-1,4-phenylene)bismaleimide.

A number of suitable maleimides, including bismaleimides of formula (III) are commercially available. For example, suitable maleimides are available from Kennedy and Klim, Inc. of Little Silver, N.J. Other suitable maleimides can be readily synthesized by known procedures, for example by thermal or acidic condensation of maleic anhydride with a compound of a structure corresponding to $R(NH_2)_2$, where R is as defined above in reference to formula (I). See, I. Varma, et al., Polymer News, vol. 12, 294–306 (1987), incorporated herein by reference.

Resins that contain electrophilic multiple bonds, or that contain both epoxy and electrophilic multiple bonds, also can be suitably employed as the crosslinking material in the compositions of the invention. Many suitable resins are commercially available, such as the bismaleimide resins available under the tradename Kerimid by Rhone-Poulenc, and Thermax MB-8000 available from Kennedy and Klim, Inc. Suitable maleimide resins are also described in the above incorporated article of I. Varma, et al., and in U.S. Pat. No. 4,987,264, incorporated herein by reference.

Another suitable crosslinker is an aromatic compound that contains one or more allyl substituents (i.e., the aromatic compound is substituted at one or more ring positions by the allylic carbon of an alkylene group). Suitable allyl aromatics include allyl phenyl compounds. More preferred is an allyl phenol compound. An allyl phenol curing agent can be a monomer, oligomer or polymer that contains one or more phenol units where the phenol units are substituted at one or more ring positions by an allylic carbon of an alkylene group. Typically the alkylene substituent(s) is propenyl, i.e., the phenol has one or more propenyl substitutents. Preferred allyl phenols include a polycondensate of phenol and hydroxybenzaldehyde and an allylhalide such as allylchloride. A number of suitable allyl phenols are commercially available, for example the allyl phenol sold under the trade name Thermax SH-150AR by Kennedy and Klim, Inc. (Little Silver, N.J.). Allyl phenyl compounds including allyl phenols and the use thereof are also described in above incorporated U.S. Patent No. 4,987,264, and in H. Stenzenberger, British Polymer Journal. 20, 383–386 (1988), incorporated herein by reference. An allyl phenol crosslinker is preferably employed in combination with a crosslinker that contains an electrophilic multiple bond, for example a maleimide crosslinker.

A composition of the invention may suitably comprise only a single type of crosslinker, e.g., only a melamine crosslinker, or a composition may contain two or more different crosslinkers. The concentration of the one or more crosslinkers in a composition may vary within a relatively wide range. As will be appreciated to those skilled in the art, suitable concentrations will vary with factors such as crosslinker reactivity and specific application of the composition. In general, a suitable concentration of one or more crosslinkers is about 5 to 30 weight percent of total solids of the composition, preferably about 10 to 20 weight percent of total solids.

Other additives may be optionally included in the compositions of the invention such as dyes, fillers, wettings agents, fire retardants and the like. A suitable filler is the product sold under the name TALC by Cyprus Chemical and a suitable dye is Orasol Blue available from Ciba-Geigy.

Photosensitizers constitute another preferred additive for purposes of the invention and are added to the composition in an amount sufficient to increase wavelength photosensitivity. Suitable photosensitizers include, for example, 2-ethyl-9,10-dimethoxyanthracene, 9,10-dichloroanthracene, 9,10-phenylanthracene, 1-chloroanthracene, 2-methylanthracene, 9-methylanthracene, 2-t-butylanthracene, anthracene, 1,2-benzanthracene, 1,2,3,4-dibenzanthracene, 1,2,5,6-dibenzanthracene, 1,2,7,8-dibenzanthracene, 9,10-dimethoxydimethylanthracene, and the like. Other suitable sensitizers include those disclosed in European Patent Application 0423446, incorporated herein by reference. Preferred sensitizers include 2-ethyl-9,10-dimethoxyanthracene, N-methylphenothiazine, and isopropylthioxanthone.

Fillers and dyes which may be present in large concentration such as, for example, in amounts of from 5 to 30 percent by weight of the total of the composition's solid components. Other optional additives such as wetting agents, gas release agents, levelling agents, etc. typically will be present in relatively low concentrations, for example less than about three weight percent of total solids of the composition.

To make a liquid coating composition, the components of the composition are dissolved in a suitable solvent such as, for example, one or more of the glycol ethers such as ethylene glycol monomethyl ether, propylene glycol monomethyl ether, dipropylene glycol monomethyl ether; esters such as a methyl cellosolve acetate, ethyl cellosolve acetate, propylene glycol monomethyl ether acetate, dipropylene glycol monomethyl ether acetate and other solvents such as dibasic esters, propylene carbonate, gamma-butyro lactone and alcohols such as n-propanol.

The dry components are dissolved in a solvent to form a liquid coating composition. The solids concentration will depend on several factors such as the method of application to a substrate. In general, the concentration of the solids in the solvent may vary from about 10 to 70 or more weight percent of the total weight of the coating composition. More specifically in the case of a curtain coating composition, the solids content may be in the range of between about 40 to 50 or more weight percent of the total weight of the composition.

The compositions of the invention may also be used to form a dry film photoresist laminate. A dry film resist laminate is typically produced by coating the liquid coating composition onto a suitable support such as a polyester film and then covering the resist film with a thin polymer film, for example a polyolefin film. The thin film can be peeled away prior to use and the solid resist layer is applied to a substrate surface by means of lamination. See, W. Deforest, *Photoresist Materials and Processes*, pp. 163-212 (McGraw Hill 1975), incorporated herein by reference.

Using a method for forming a printed circuit board for purposes of exemplification, a composition of the invention may be applied to a substrate having a pattern of conductive material disposed thereon. The substrate may be a copper laminate substrate prepared by the methods described in Coombs, *Printed Circuits Handbook*, McGraw-Hill, (3rd ed. 1988), incorporated herein by reference. Other suitable substrates include those prepared by laminating multilayer boards for the manufacture of printed circuit boards with vias (through-holes) and interconnections which may contain solder, as described in the above incorporated Printed Circuits Handbook.

The compositions of the invention may be coated onto the substrate using conventional techniques including screen printing, curtain coating, roller coating, slot coating, spin coating, flood coating, electrostatic spray, spray coating, dip coating and as a dry film. As indicated above, the viscosity of the composition may be adjusted to meet the requirements for each method of application by adding additional solvent for methods requiring low viscosity or thickening agents and fillers for methods requiring high viscosity.

After coating, a liquid composition layer is dried to remove solvent. Care should be taken to avoid acid or base in the composition components and excessive temperatures (e.g., temperatures in excess of about 100° C.) to prevent premature crosslinking of the composition.

The process of photo-reproducing a desired image to the photoimageable layer is well known in the art and involves exposing the layer to a source of activating radiation to initiate generation of acid or base in the exposed area. Suitable sources of activating radiation include an ultraviolet light source, electron beam, or x-rays. The photogenerated acid or base will initiate a reaction of one or more of the polymerizable components of the composition. The imaged coating layer of the composition is typically heated after exposure to induce or enhance crosslinking in exposed areas. Exemplary post exposure bake conditions include heating to about 85° to 110° C. or greater for between about 10 to 40 minutes. Suitable heating times will vary with the particular post exposure bake temperature employed, with lower bake temperatures generally requiring longer heating periods.

By employing in a composition an effective concentration of an aqueous soluble resin that contains polar functional groups such as the above described phenolic resins, the area of the coating not exposed to activating radiation is developable in aqueous solutions such as sodium hydroxide, sodium carbonate, potassium hydroxide, potassium carbonate, ethylene diamine and the like. Alternatively, the unexposed portions of a coating layer of the composition can be developed with a semi-aqueous solution. Suitable semi-aqueous solutions include alcoholic mixtures of alkali hydroxides wherein the alcohol is water miscible and present in the aqueous solution in concentrations of from about 2 to 20 percent by volume, preferably less than about 10 percent by volume.

The compositions of the invention will also be solvent developable in suitable organic developers including polar solvents such as alcohols and glycol ethers and mixtures thereof. Specific suitable organic developers include gamma-butryo lactone, propoxy propanol and N-methyl pyrrolidone.

Thermal curing after development may be conducted at temperatures ranging from about 120° to 180° C., preferably 120° to 140° C., for a period of time between about 20 and 120 minutes. The thermal cure hardens unreacted components, promotes flexibility of the coating layer and can enhance adhesion of the coating layer to the substrate. The coating layer also may be post cured using RF or microwave energy by methods well known in the coatings industry.

Many of the thermally cured compositions of the invention will be highly useful as a soldermask, and will exhibit solder resistance and adhere well to copper circuitry. For example, compositions of the invention have withstood 550° F. solder flotation tests for 10 to 30 seconds without any blistering or other visible degradation of the thermally cured coating layer.

Additionally, the cured coating layers of some compositions of the invention have high glass transition temperatures, including glass transition temperatures of 125° C. and greater and $T_g$s of 150° C. and greater.

A crosslinked coating layer of a composition of the invention has the property of substantial flexibility. A more flexible crosslinked coating layer is highly advantageous because, for example, less care is required to prevent cracking or other degradation of the layer during subsequent processing steps. Cured coating layers of the compositions of the invention typically withstand 180° C. bend tests without cracking or any other degradation of the cured coating layer. Elongation testing of cured coating layers of the compositions provide values of 5 percent and greater elongation without any detection of degradation of the coating layer. In particular, the composition of Example 3, infra, exhibited an elongation value of 7 to 8 percent. It is believed that elongation values of a composition can be increased by increasing the concentration of the internally epoxidized polybutadiene component of a composition, and by reduction in the amounts of other compoisition constituents such as phenolic resin. As is known to those in the art, the term "elongation value" is the length of a sample stretches before breaking, expressed as a percentage of the sample length prior to stretching. For example, a one centimeter long sample which breaks after stretching to a 1.10 centimeter length would be said to have a 10 percent elongation value.

Thus, some of the compositions of the invention will be highly useful as flexible photoimageable cover coats in the manufacture of flexible circuits. A suitable process for the manufacture of a flexible circuit provides for etching a flexible base material to form a circuit layer by standard procedures (e.g., print and etch), stripping of photoresist, followed by cleaning of the base material surface. A composition of the invention is then applied to the cleaned surface. The composition may be suitably applied to the base material by a variety of coating means, for example roller coating or screen coating. The applied coating layer is then imaged and developed to provide openings, e.g., for solder pads. The coated base material can then be processed and used in accordance with known procedures. For such flex circuit applications, the photoimageable composition preferably comprises a brominated phenolic resin binder to provide a more fire retardant composition coating layer. As is clear to those in the art, a brominated phenolic resin is a resin where at least a portion of the resin phenolic units are bromo substituted at one or more available ring positions.

Compositions of the invention will also be useful as dielectric innerlayers for multilayer printed circuit boards that are produced by a sequential layering process as described above and in U.S. Pat. No. 4,902,610. For example, a composition of the invention can be coated over a first circuit layer and then the coating layer imaged to provide openings that define interconnections, and then one or more other board layers sequentially formed over the imaged composition layer to form a circuit board having two or more layers of circuitry. The first circuit layer will be in electrical connection with other circuit layer(s) of the board by means of the imaged openings of the coating layer. A typical application of a dielectric innerlayer would comprise application of a two mil layer of a photoimageable composition of the invention over a pre-cleaned circuitry substrate having 6-mil wide conductors; formation of 3-mil diameter via apertures in the coating layer by means of exposure and developed as discussed above; and post-development curing of the photodielectric layer. The via aperatures will be located at predetermined sites within the width of the underlying conductors. Thus the apertures can be formed simultaneously rather than individually drilling holes as is done in conventional multilayer board manufacturing processes. Further, the apertures can be significantly smaller in such a sequential fabrication process than can be done by drilling. For example, photoformed via apertures can be provided with diameters as small as 2 mil. Additionally, via apertures of any shape can be imaged and developed, including squares and slots. The vias can then be plated with electroless copper at the same time as the second layer of circuitry conductors are plated.

Other applications of the compositions of the invention include use as an outerlayer for surface pad mounts where, the pads interconnected to the underlying circuit layer of a printed circuit board by means of electrolessly plated photoformed vias. The compositions of the invention can also be used as a resist in full-build additive plating processes such as printed circuit manufacturing processes. For a full-build additive circuit manufacturing process, it is highly desirable to employ a permanent photoimageable dielectric mask as insulation between the electrolessly plated circuitry conductors. Further, the photoimageable mask should be capable of fine line resolution, aqueous developable and serve as a resist to full build high pH electroless copper plating solutions for many hours at elevated temperatures without unwanted extraneous copper deposition on the mask.

The following non-limiting Examples are illustrative of the invention.

EXAMPLES 1 through 17

Seventeen different photoimageable compositions of the invention were prepared by admixing the components in the amounts as specified in the below Table. Amounts listed in the Table grid are expressed in parts by weight based on the total weight (including solvent) of the specified composition.

TABLE

| Composition of Example Number | Resin Binder | Amount Resin Binder | Amount Epoxy Butadiene | Amount Melamine | Amount Epoxy Resin | Amount Photoinitiator |
|---|---|---|---|---|---|---|
| 1 | AA | 50 | 30 | 10 | 10 | 4 |
| 2 | AB | 45 | 35 | 10 | 10 | 4 |
| 3 | AC | 45 | 35 | 10 | 10 | 4 |
| 4 | AD | 50 | 30 | 10 | 10 | 4 |
| 5 | AE | 60 | 30 | 10 | — | 4 |
| 6 | AF | 50 | 40 | 10 | — | 4 |
| 7 | AC | 45 | 35 | 20 | — | 4 |
| 8 | AC | 60 | 30 | 10 | — | 4 |
| 9 | AC | 45 | 25 | 10 | 20 | 4 |
| 10 | AC | 45 | 35 | 10 | 10 | 4 |
| 11 | AC | 30 | 40 | 15 | 15 | 4 |
| 12 | AC | 57 | 15 | 10 | 18 | 4 |
| 13 | AC | 45 | 45 | 10 | — | 4 |
| 14 | AC | 40 | 50 | 10 | — | 4 |
| 15 | AC | 35 | 55 | 10 | — | 4 |
| 16 | AB<br>AC | 25<br>25 | 30 | 10 | 10 | 4 |
| 17 | AC<br>AF | 25<br>25 | 40 | 10 | — | 4 |

In addition to the components listed in the above Table, 2-ethyl-9,10-dimethoxyanthracene was employed as a photosensitizer in each of the compositions at a concentration of 1 part by weight based on the total weight of the specified composition.

The solvent used in each of the compositions was propylene glycol monomethyl ether acetate. Each of the compositions was formulated at about 42 percent by weight solids.

In the above Table, the following designations represent the following materials:

Resin Binders

AA is a cresol-formaldehyde novolak having a molecular weight (weight average) of about 11,000.

AB is a m-cresol-formaldehyde having a melting point of about 145°-1550° and a molecular weight (Weight average) of about 5500.

AC is a poly(vinylphenol) resin having a molecular weight (weight average) of about 5200.

AD is a poly(vinylphenol) resin having a molecular weight (weight average) of about 13700.

AE is a partially hydrogenated polyvinyl phenol resin containing phenolic and nonaromatic cyclic alcohol units and having a molecular weight (weight average) of about 5200.

AF is a polyacrylate formed by free radical polymerization of the following monomer mixture: about 12 parts by weight methacrylic acid, 8 parts by weight hydroxyl-ethylmethyl acrylate, 40 parts by weight butyl acrylate and 49 parts by weight methylmethacrylate.

The epoxy butadiene used in the compositions was an epoxidized polybutadiene obtained from Atochem North America, Inc. (Philadelphia, Pa.) under the tradename Poly bd 605 Resin and was a compound of formula (I) as defined above where R and $R^1$ are both hydroxyl and $R^2$ is an alkylene carbon that forms a pendant vinyl group. The polybutadiene had a molecular weight of about 5500 and an epoxy equivalent weight of about 260.

The melamine used in the compositions was a melamine-formaldehyde resin available from American Cyanamid under the trade name Cymel 303.

Except for the composition of Example 10, the epoxy resin was aromatic bisphenol epoxy resin available from Shell Chemical Co. under the trade name EPON 828. In the composition of Example 10, an epoxy novolak resin was employed, available from Ciba-Geigy under the tradename EPN-1139.

The photoinitiator used the compositions was the acid generator triarylsulfonium antimonate.

EXAMPLE 18

Formation of relief images

Each of the compositions of Examples 1-17 above were separately applied by Meier rod to a dry film thickness of about 22 to 28 microns on the copper surface of a one-sided copper-clad plastic laminate. Prior to application of a composition, the copper surface of the substrate had been scrubbed clean with pumice-based Scrub Cleaner 28 (available from the Shipley Co.), followed by water rinsing and drying of the scrubbed copper surface. The applied liquid coatings were dried for 45 minutes in a 90° C. fresh air circulating convection oven. The coated parts were then each exposed with a Mimir light source using a 1000 mJ/$cm^2$ exposure dose, except for the part coated with the composition of Example 5 which required a higher exposure dose. The compositions of each of Examples 1-17 were subject to broad band exposure. All the parts were contact printed, except for parts coated with compositions of Examples 11 and 15 which were exposed off-contact. Following exposure the coated parts were post exposure baked for 15 minutes at 100° C. After cooling, the exposed coating layers were immersion developed at about 30°-35° C. with Developer 303A (aqueous sodium hydroxide developer available from the Shipley Co.) except for the part coated with the composition of Example 6 which was developed with a one percent aqueous sodium carbonate solution. For each of the coated parts, the aqueous development completely removed the composition from unexposed areas of the substrate to provide good quality negative tone relief images. Resolution of 1 mil wide lines and spaces was typically achieved for each of the compositions. The developed coating layers were then cured at either 120° C. or 140° C. for 60 minutes.

EXAMPLES 19-21

Flexibility testing and flexible circuit applications

Example 19

Copper laminate parts with developed and cured coating layers of each of the compositions of Examples 1-17 were prepared as described in Example 18 above. Each part was then subjected to the following flexibility test: A 0.5 inch wide coated copper laminate strip was sheared from the part. In each case, the sheared edges of the 0.5 inch wide strip were clean and free of any noticeable cracking of the cured composition. The underlying plastic laminate strip was then fractured, but without fracture to the copper layer or overcoated cured composition. The overcoated copper layer was then pulled 180° back on itself. For each of the parts, no cracking or other degradation of the composition coating layer was observed.

Example 20

The compositions of Examples 13-15 were each coated onto a flexible circuit base material and exposed, developed and cured as described in Example 18 above. These coated substrates were then wrapped 180° C. around a one quarter inch diameter mandrel. For each of the coated substrates, adhesion of the cured composition to the underlying flexible copper circuit base layer was excellent and no evidence of cracking or crazing of the composition layer as a result of the bend test was observed.

Example 21

Adhesiveless copper-clad films of the polyimide sold under the tradename Kapton and the polyester sold under the tradename Mylar were etched to remove the copper. The composition of Example 1 above was applied to the Kapton film, and the composition of Example 13 above was applied to the Mylar film to provide film thicknesses of about 20-25 microns. The coated films were exposed, developed and cured as generally described in Example 18 above. After curing, the patterned coating layers had excellent adhesion to the film substrates and withstood a 180° bend test in both directions without any cracking.

EXAMPLE 22

Solder resistance

The compositions of Examples 2, 3, 9, 13, 14 and 15 were each coated onto separate copper-clad plastic laminates and dried, exposed, enhancement baked, developed and cured by the procedures described in Example 18 above. The cured composition layers were then cut in a cross hatch pattern with a razor blade. The thus cut coating layers were then subjected to a 550° F. solder flotation test for ten seconds. No solder wicking was observed, even in the cross hatch areas where copper metal had been exposed and where soldering occurred. The coating layers showed no blistering or any other visible effects as a result of the solder flotation test. A second set of copper-clad laminates were prepared having developed, cured coating layers of the compositions of Examples 2, 3, 9, 13 and 15. These coated parts were subjected to a 550° C. solder flotation test for 30 seconds. The coating layers showed no blistering or any other visible effects as a result of the solder flotation test.

EXAMPLE 23

Full-build additive plating

One ounce copper clad epoxy laminates substrates were etched to thereby bare a roughened epoxy surface with micropores. The substrates were then immersed in the electroless catalyst solution CATAPOSIT 44 (available from the Shipley Co.) for five minutes followed by water rinsing and drying of the treated substrates. By means of a #44 Meier rod, the compositions of Examples 3 and 13 were applied to separate catalyzed copper clad substrates, dried, image exposed, enhancement post exposure baked for 15 minutes at 100° C., developed with 303A Developer (Shipley Co.), rinsed, dried and cured for 60 minutes at 140° C. to provide 1.1 mil deep trenches exposing the catalyzed epoxy in a circuitry pattern. The parts were then immersed in Accelerator 19A (available from Shipley Co.) for five minutes to accelerate the palladium/tin plating catalyst, water rinsed, and then placed in a full build electroless copper bath until a 1 mil thickness (about 25 microns) had been deposited in the noted trenches. The plating bath was operated at about 70° C. and deposited copper at about 2.2 microns per hour. No evidence of unwanted extraneous copper or of any attack of copper on the composition relief images were observed. The produced circuitry lines were contained within the thickness of the applied permanent masks.

EXAMPLE 24

Moisture insulation testing

The compositions of Examples 2, 3, 9, and 13 were each coated onto separate copper-clad plastic laminates and dried, exposed, enhancement baked, developed and cured by the procedures described in Example 18 above. The coated copper-clad laminates were then subjected to IPC Test No. SM840B which provides for exposure in a high humidity chamber (90% r.h.) at a temperature of about 25°-65° C. with 7 day cycling. The IPC Test specifies a minimum accepability at $0.5 \times 10^{-8}$. Each of the tested composition coating layers exceeded a value of $0.1 \times 10^{-10}$.

The foregoing description of the invention is merely illustrative thereof, and it is understood that variations and modifications can be effected without departing from the scope or spirit of the inventions as set forth in the following claims.

What is claimed is:

1. A process for the formation of a circuit board having two or more layers of circuitry, comprising:
    applying a photodielectric coating layer over a first circuit layer, the photodielectric coating layer comprising a resin binder, a polybutadiene that comprises one or more internal epoxide groups, and a radiation sensitive component selected from the group consisting of a photoacid generator or a photobase generator,
    forming in the photoelectric coating layer one or more photoimaged openings defining electrical interconnections, and
    sequentially forming a second circuit layer over the photodielectric coating layer, the second circuit layer being in electrical connection with the first circuit layer by means of the photoimaged openings of the coating layer.

2. The process of claim 1 where the composition further comprises a crosslinking agent.

3. The process of claim 2 where the crosslinking agent comprises a melamine.

4. The process of claim 2 where the crosslinking agent comprises a mixture of a melamine and a compound containing one or more epoxy groups.

5. The process of claim 2 where the crosslinking agent comprises one or more materials selected from the group consisting of an amine-based compound, a compound containing one ore more epoxy groups, a compound containing one or more vinyl ether groups, a compound containing one or more electrophilic multiple bonds, and an aromatic compound containing one or more allyl substituents.

6. The process of claim 2 where the polybutadiene comprises hydroxyl and vinyl groups.

7. The process of claim 2 where the polybutadiene is miscible with the polymerizable components of the composition upon curing of the composition.

8. The process of claim 2 where the polybutadiene is a compound of the following formula (I):

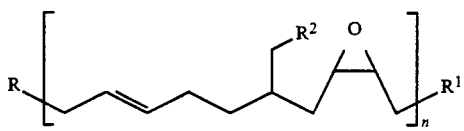

where R and $R^1$ are each independently selected from the group consisting of hydrogen, substituted and unsubstituted alkyl, substituted and unsubstituted aryl, epoxy, hydroxy and alkylene; $R^2$ is selected from the group consisting of alkylene and alkyl; and n is an integer equal to 2 or greater.

9. The process of 2 where the polybutadiene is a compound of the following formula (IA):

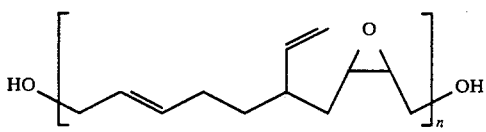

where n is an integer between about 10 and 25.

10. The process of claim 2 where the polybutadiene has a molecular weight of at least about 4,000.

11. The process of claim 2 where the polybutadiene has a molecular weight of from about 4,000 to 8,000.

12. The process of claim 2 where the resin binder comprises a phenolic resin.

13. The process of claim 2 where the phenolic resin binder is selected from the group consisting of (1) a novolak resin, (2) a poly(vinylphenol) resin, (3) a resin containing phenolic units and cyclic alcohol units, and (4) a brominated phenolic resin.

14. The process of claim 2 where the resin binder component comprises a non-reactive resin.

15. The process of claim 1 where the applied photodielectric coating layer is exposed to patterned activating radiation and then developed to form said photoimaged openings.

16. The process of claim 15 where the photodielectric coating layer is developed with an aqueous alkaline solution.

17. The process of claim 1 where the polybutadiene comprises hydroxyl and vinyl groups.

18. The process of claim 1 where the polybutadiene is miscible with the polymerizable components of the composition upon curing of the composition.

19. The process of claim 1 where the polybutadiene is a compound of the following formula (I):

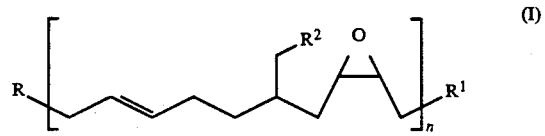

where R and $R^1$ are each independently selected from the group consisting of hydrogen, substituted and unsubstituted alkyl, substituted and unsubstituted aryl, epoxy, hydroxy and alkylene; $R^2$ is selected from the group consisting of alkylene and alkyl; and n is an integer equal to 2 or greater.

20. The process of 1 where the polybutadiene is a compound of the following formula (IA):

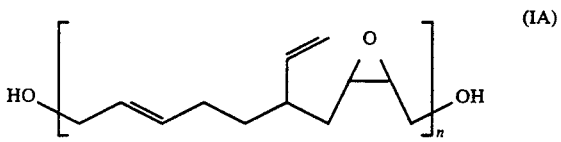

where n is an integer between about 10 and 25.

21. The process of claim 1 where the polybutadiene has a molecular weight of at least about 4,000.

22. The process of claim 1 where the polybutadiene has a molecular weight of from about 4,000 to 8,000.

23. The process of claim 1 where the resin binder comprises a phenolic resin.

24. The process of claim 1 where the phenolic resin binder is selected from the group consisting of (1) a novolak resin, (2) a poly(vinylphenol) resin, (3) a resin containing phenolic units and cyclic alcohol units, and (4) a brominated phenolic resin.

25. The process of claim 1 where the resin binder component comprises a non-reactive resin.

* * * * *